US009087692B2

(12) United States Patent
Accardi et al.

(10) Patent No.: US 9,087,692 B2
(45) Date of Patent: Jul. 21, 2015

(54) METHOD FOR TRANSFERRING A GRAPHENE LAYER

(71) Applicant: STMicroelectronics S.r.l., Agrate Brianza (IT)

(72) Inventors: Corrado Accardi, Ragusa (IT); Stella Loverso, Catania (IT); Sebastiano Ravesi, Catania (IT); Noemi Graziana Sparta, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 34 days.

(21) Appl. No.: 13/762,819

(22) Filed: Feb. 8, 2013

(65) Prior Publication Data

US 2013/0210218 A1    Aug. 15, 2013

(30) Foreign Application Priority Data

Feb. 10, 2012    (IT) .............................. MI2012A0191

(51) Int. Cl.
*H01L 21/02*   (2006.01)
*H01L 51/00*   (2006.01)
*C01B 31/04*   (2006.01)
*B82Y 30/00*   (2011.01)
*B82Y 40/00*   (2011.01)

(52) U.S. Cl.
CPC ........... *H01L 21/02527* (2013.01); *B82Y 30/00* (2013.01); *B82Y 40/00* (2013.01); *C01B 31/0453* (2013.01); *C01B 31/0484* (2013.01); *H01L 51/00* (2013.01); *H01L 51/003* (2013.01)

(58) Field of Classification Search
CPC .... B82Y 30/00; B82Y 40/00; C01B 31/0446; C01B 31/0438; C01B 31/0206; H01L 29/1606; H01L 21/02376; H01L 51/003
See application file for complete search history.

(56) References Cited

U.S. PATENT DOCUMENTS

2011/0030991 A1*   2/2011   Veerasamy ................ 174/126.1
2011/0048625 A1    3/2011   Caldwell et al.
(Continued)

FOREIGN PATENT DOCUMENTS

EP          2 489 520 A2    8/2012
WO      WO2011046415    *   4/2011    ............... B41M 5/03

OTHER PUBLICATIONS

Youngbin et al. Wafer-Scale Synthesis and Transfer of Graphene Films Nano. Lett. 2010, 10 pp. 490-493.*
(Continued)

*Primary Examiner* — Duy Deo
*Assistant Examiner* — Erin Bergner
(74) *Attorney, Agent, or Firm* — Seed IP Law Group PLLC

(57) ABSTRACT

A method transfers a graphene layer from a donor substrate onto a final substrate. The method includes: providing a metal layer on the donor substrate; and growing a graphene layer on the metal layer. The method also includes: laminating a dry film photo-resist on the graphene layer; laminating a tape on the dry film photo-resist; chemically. etching the metal layer, obtaining an initial structure that includes the tape, the dry film photo-resist and the graphene layer; laminating the initial structure on the final substrate; thermally realizing the tape, so as to obtain an intermediate structure that includes the dry film photo-resist, the graphene layer and the final substrate; removing the dry film photo-resist; and obtaining a final structure that includes the final substrate with a transferred graphene layer.

8 Claims, 4 Drawing Sheets

(56) References Cited

U.S. PATENT DOCUMENTS

| | | | |
|---|---|---|---|
| 2011/0108521 A1 | 5/2011 | Woo et al. | |
| 2012/0146743 A1* | 6/2012 | Ermolov | 333/161 |
| 2012/0181507 A1* | 7/2012 | Dimitrakopoulos et al. | 257/29 |
| 2012/0196074 A1 | 8/2012 | Ago et al. | |
| 2012/0258311 A1* | 10/2012 | Hong et al. | 428/408 |

OTHER PUBLICATIONS

Bae et al., "Roll-to-roll production of 30-inch graphene films for transparent electrodes," *Nature Nanotechnology*:1-5, Jun. 20, 2010, 6 pages.

de Jong, "Preparation of graphene by a Langmuir-Schaefer approach," PhD project proposal, Zernike Institute for Advanced Materials, University of Groningen, Jul. 12, 2010, 21 pages.

Do et al., "Graphene and its one-dimensional patterns: from basic properties towards applications," *Advances in Natural Science: Nanoscience and Nanotechnology 1*:1-14, Oct. 21, 2010, 14 pages.

Emtsev et al., "Towards wafer-size grapheme layers by atmospheric pressure graphitization of silicon carbide," *Nature Materials 8*:203-207, Feb. 8, 2009.

Geim et al., "The rise of graphene," *Nature Materials 6*(3):183-191, 2007, 14 pages.

Kim et al., "Large-scale pattern growth of grapheme films for stretchable transparent electrodes," *Nature 457*:706-710, Feb. 5, 2009.

Li et al., "Graphene Films with Large Domain Size by a Two-Step Chemical Vapor Deposition Process," *Nano Letters 10*(11):4328-4334, 2010, 7 pages.

Li et al., "Synthesis, Characterization, and Properties of Large-Area Graphene Films," *The Electrochemical Society Transactions 19*(5):41-52, 2009.

Liang et al., "Graphene Transistors Fabricated via Transfer-Printing In Device Active-Areas on Large Wafer," *Nano Letters 7*(12):3840-3844, 2007.

Novoselov et al., "Electric Field Effect in Atomically Thin Carbon Films," *Science 306*:666-669, Oct. 22, 2004.

O'Brien et al., "CVD Synthesis and Characterization of Graphene Thin Films," ARL-TR-504, Army Research Laboratory, Jan. 2010, 24 pages.

Park et al., "Chemical methods for the production of graphenes," *Nature Nanotechnology*:1-8, Mar. 29, 2009.

Pham, "Transferring Chemical Vapor Deposition Grown Graphene," PROC Abstract in *2010 NNIN REU Research Accomplishments*, pp. 192-193.

Rangel et al., "Mechanism of carbon nanotubes unzipping into grapheme ribbons," *The Journal of Chemical Physics 131*:031105, 2009, 4 pages.

Si et al., "Synthesis of Water Soluble Graphene," *Nano Letters 8*(6):1679-1682, 2008.

Wang et al., "Chemical Self-Assembly of Graphene Sheets," *Nano Research 2*:336-342, 2009.

Yu et al., "Graphene segregated on Ni surfaces and transferred to insulators," *Applied Physics Letters 93*:113103, 2008, 3 pages.

\* cited by examiner

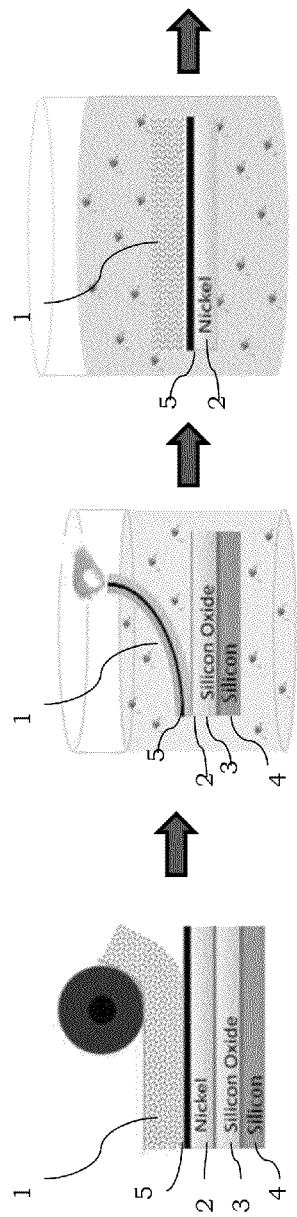
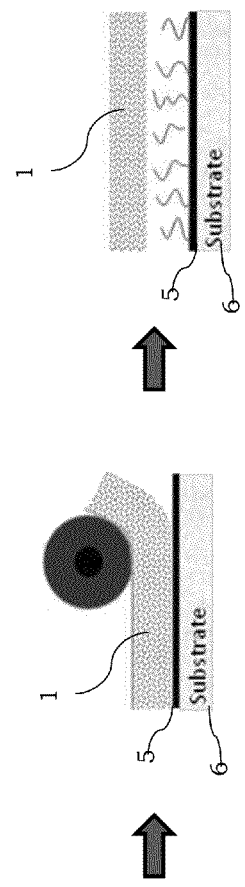
FIG. 1A PRIOR ART
FIG. 1B PRIOR ART
FIG. 1C PRIOR ART
FIG. 1D PRIOR ART
FIG. 1E PRIOR ART

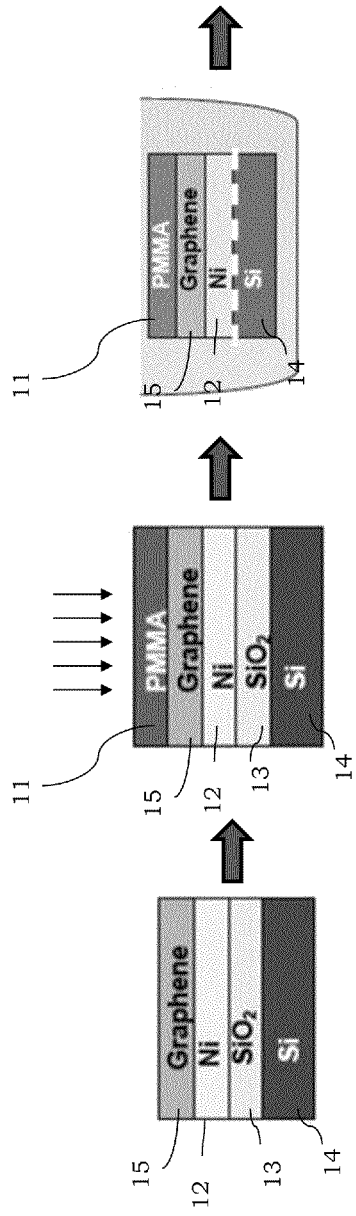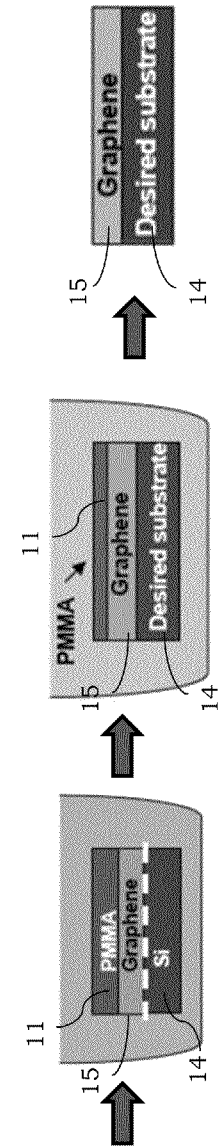

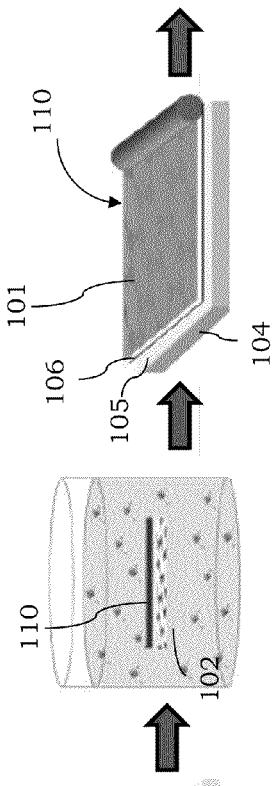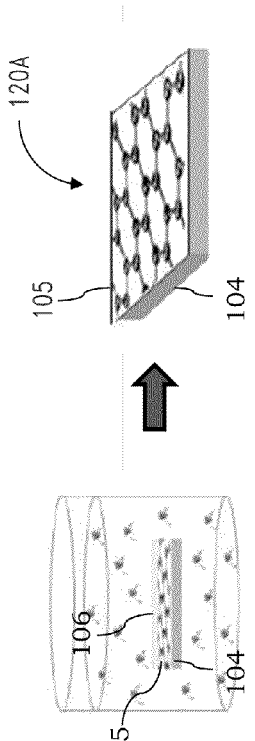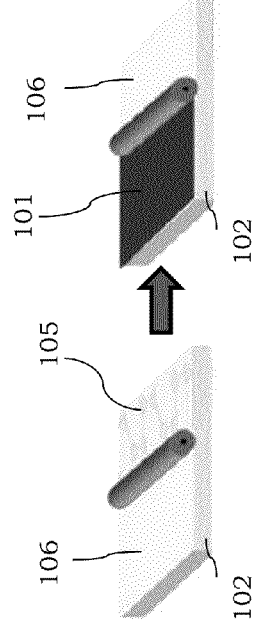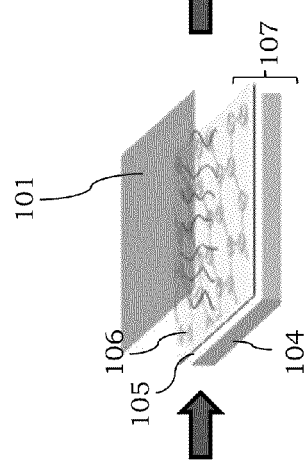
FIG. 3A  FIG. 3B  FIG. 3C  FIG. 3D
FIG. 3E  FIG. 3F  FIG. 3G

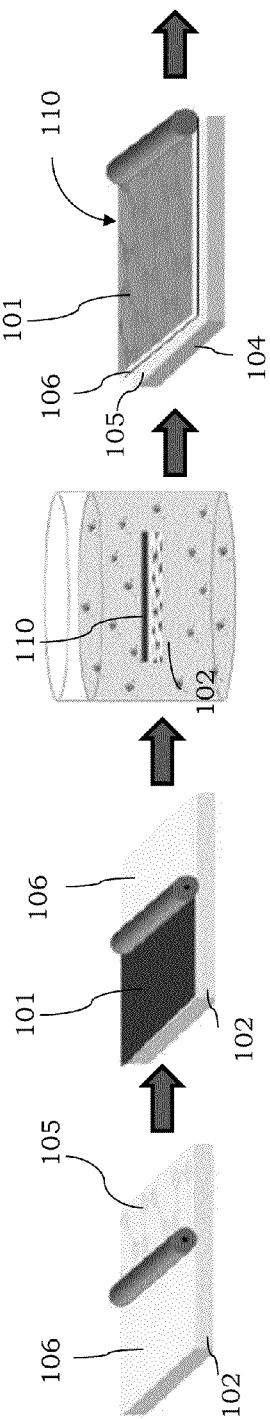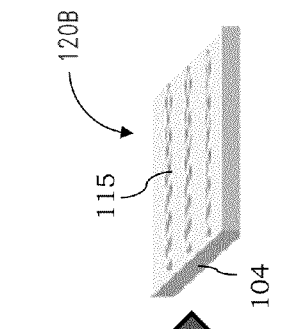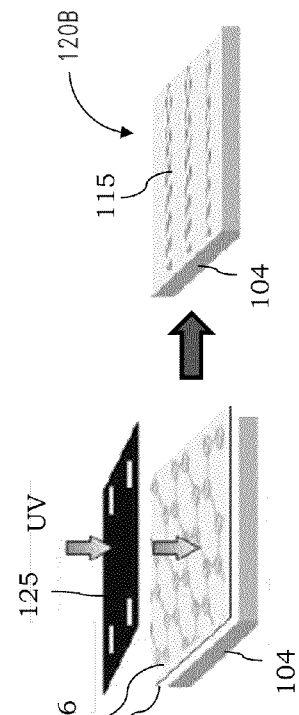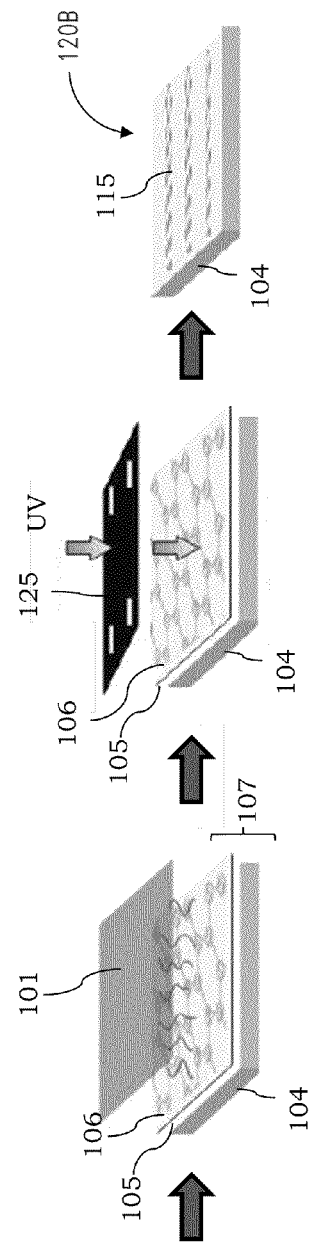

METHOD FOR TRANSFERRING A GRAPHENE LAYER

BACKGROUND

1. Technical Field

The present disclosure relates to a method for transferring a graphene layer onto a substrate.

The disclosure refers, in particular, but not exclusively, to a method for transferring a graphene layer from a donor substrate to a different substrate, of the type comprising a rigid or a flexible material, and the following description is made with reference to this field of application just for explanation convenience.

2. Description of the Related Art

In recent years, many studies have been done on the production and transferring of graphene, which is a material comprising a single layer of carbon atoms placed in an hexagonal crystal lattice and having excellent electrical and optical properties. It is well known, in fact, that graphene is a zero gap semiconductor material having high charges mobility (10,000 cm2/Vs), high conductivity, high transmittance (~98%) and excellent mechanical properties (high tensile stress equal to 130 GPa). Graphene has a honeycomb geometry such that the electrons of the carbon atoms are forced to move along the plane defined by the graphene sheet following hexagonal paths. Consequently the electrons behave as no mass particles having a speed light like. Due to these particular properties, graphene seems to be qualified to be used in nano-electronic applications, sensors applications and sustainable energy applications, such as:

photovoltaics;

Touch screens, organic light emitting diodes (OLEDs), liquid crystal displays;

sensors;

components of an integrated circuit (such as bipolar transistors, FETs . . . );

large area devices; and flexible integrated circuits, to name few.

Geim and Novoselov, Manchester University, won the Nobel prize for having extracted a graphene mono-atomic layer from a graphite bulk material.

In fact, a graphene sheet, having hybridized sp2 carbon atoms, can be considered as the base structure of other graphitic materials, like fullerene (OD), carbon nanotubes (1D), graphite (3D). Graphite, in particular, has a crystal lattice comprising stacked layers linked together by Van der Waals-like inter-layer bonds having energy equal to 2 eV/nm2. Consequently, graphite is easily exfoliable along a direction parallel to the crystal plane exercising forces around 300 nN/mm2.

Different methods have been proposed for graphene production and in particular:

a mechanical exfoliation of graphite, described in "Electric Field Effect in Atomically Thin Carbon Films", K. S. Novoselov et al., Science, 306, 666-669 (2004); and in "Graphene Transistors Fabricated via Transfer-Printing In Device Active-Areas on Large Wafer", Xiaogan Liang, Zengli Fu, and Stephen Y. Chou, Nanoletters (2007);

a graphitization of silicon carbide, described in "Towards Wafer-Size Graphene Layers by Atmospheric Pressure Graphitization of Silicon Carbide", Emtsev, K. V. et al., Nature Mater. 8, 203-207 (2009);

a chemical vapor deposition (CVD) for growing metallic substrates, described in "Graphene Segregated on Ni Surfaces and Transferred to Insulators", Qingkai Yu, Jie Lian, Applied Physics Letters 93, 113103 (2008); and in "Graphene Films with Large Domain Size by a Two-Step Chemical Vapor Deposition Process", Xuesong Li, et al. Nano Lett. (2010);

an exfoliation in liquids, described in "Synthesis of Water Soluble Graphene", Yongchao Si and Edward T. Samulski, Nano Lett. (2008); and in "Chemical Methods for the Production of Graphenes", Sungjin Parkl and Rodney S. Ru, Nature Nanotechnology (2009); and carbon nanotubes "unzipping", described in "Mechanism of Carbon Nanotubes Unzipping into Graphene Ribbons", Norma L. Rangel, Juan C. Sotelo, and Jorge M. Seminario, THE JOURNAL OF CHEMICAL PHYSICS (2009).

More in detail, the mechanical graphite exfoliation comprises applying onto the crystal surface of highly oriented graphite (HOPG) a force, usually using an adhesive tape, for peeling and deploying the crystal layers in order to obtain an isolated single layer. This technique is very simple and accessible for isolating graphene flakes of some square microns, and it is used especially in the University research projects. Moreover, the graphene samples obtained have optimal electric and mechanical properties. Nevertheless, even if this method is very simple and low cost, it cannot be used for industrial production, due to the reduced dimensions of the graphene sheets so produced.

In case of the graphitization of silicon carbide (SiC), the graphene is obtained by a high temperature annealing of a silicon carbide crystal which is exfoliated along the direction of the Si-rich (0001) plane or the C-rich (0001) plane. This technique has very high costs and is limited by the diameter of the silicon carbide wafer. In addition, the produced graphene has many defects due to the silicon carbide superficial morphology.

Furthermore, the technique using chemical vapor deposition (CVD) involves poly-crystal substrates of different transition metals, such as nickel, copper, iridium, platinum, which act as catalyst for the growth of the graphene. As an example, a nickel film is exposed to a gas flow comprising hydrocarbons and hydrogen at a temperature equal to 900°/1000° C. At these temperatures, carbon forms a solid solution with nickel, so that, cooling the substrate at high speed, the carbon forms one or more graphene layers in the solution. As an example, using copper, the substrate is exposed to a methane/hydrogen flux at 1000° C., forming CxHy. The whole surface of such a substrate is covered by graphene nuclei formed in specific conditions of pressure, density and temperature. The advantage of this technique is that has a low cost and provides good quality graphene monolayer films, especially using copper.

On the other hand, the technique providing a graphite exfoliation in liquid phase within an organic solvent allows to obtain colloids of graphene sheets. The exfoliation is promoted by sonication, particularly for a solvent having a superficial energy equal to the graphene energy, such an exfoliation being due to the interaction between the solvent and several graphene layers. Good solvents for exfoliation are: N-methylpyrrolidone (NMP), N-dimethylacetamide (DMA), N-dimethylformamide (DMF), G-butyrolactone (GBL), and others of the same type. Even if a large number of graphene monolayer films are so produced, the total weight being up to 50%, the solvents which have to be used are too expensive and dangerous.

At the end, a carbon nanotubes "unzipping" can be realized in different manner:

by a chemical etch of nanotubes with sulfuric acid and potassium permanganate as oxidant agent;

by a chemical etch of nanotubes partially immerged in a polymeric material in presence of Argon plasma;

by introducing alkali metal atoms among the concentric cylinders of carbon nanotubes and obtaining the graphene sheets with "lift-off" techniques.

Even if all the above described chemical techniques are advantageous for the scalability and flexibility, they do not guarantee a control of the number of dispersed graphite layers. Consequently, the isolation of a single graphene monolayer should become possible only using complicated separation techniques.

In particular, for the graphene production techniques based on the Chemical Vapor Deposition (CVD) growth on metallic substrates or based on exfoliation, the problem of transferring the graphene monolayer on an insulating substrate has recently been studied.

There are also four known, well-used transferring techniques.

1) Transferring using a thermal release tape, as described, for example, in the US patent application published on Mar. 3, 2011 under N. US 2011/0048625 in the name of Caldwell et al. This technique in particular comprises the following phases, described with reference to FIGS. 1A-1E:

laminating an adhesive thermal release tape 1 on a metal layer 2, such as nickel (Ni) or copper (Cu), formed on a silicon oxide layer 3 formed on a silicon substrate 4, the metal layer 2 having on its surface, opposite to the silicon oxide layer 3, a graphene layer obtained by a chemical vapor deposition (CVD), or CVD graphene layer 5, as shown in FIG. 1A;

detaching the metal layer 2 with the CVD graphene layer 5 and the adhesive thermal release tape 1 from the structure comprising the silicon substrate 4 and the silicon oxide layer 3, as shown in FIG. 1B;

chemically etching the metal layer 2 to temporary transfer the CVD graphene layer 5 on the adhesive thermal release tape 1, as shown in FIG. 1C;

laminating the adhesive thermal release tape 1 on a generic substrate 6, as shown in FIG. 1D; and thermally releasing from the adhesive thermal release tape 1, thus transferring the CVD graphene layer 5 on the substrate 6, as shown in FIG. 1E.

Even if this technique is advantageous under many aspects, such as high productivity and scalability on a large area, it has the drawback that the glue on the tape is randomically kept on the transferred graphene layer, causing breaks on it.

2) Transferring through a liquid resist, such as poly-methyl methacrylate or PMMA, this technique uses a liquid resist, in particular the PMMA, as a support for temporarily keeping a graphene layer. In particular, the technique comprises the following phases, described with reference to FIGS. 2A-2F:

growing a graphene layer 15 on a metal layer 12, such as nickel (Ni) or copper (Cu), formed on a silicon oxide layer 13 formed on a silicon substrate 14, as shown in FIG. 2A;

depositing a PMMA layer 11 on the graphene layer 15 through a "spin coating" or "casting" technique and, then, thermally stabilizing the graphene layer 15 and the PMMA layer 11 on it, as shown in FIG. 2B;

optionally wet etching the silicon oxide layer 13, as shown in FIG. 2C;

wet etching the metal layer 12, releasing the graphene layer 15 from the silicon substrate 14 and temporary transferring the graphene layer 15 on the PMMA layer 11, as shown in FIG. 2D;

transferring the PMMA layer 11 on a generic substrate 16, as shown in FIG. 2E;

wet etch removal of the PMMA layer 11, thus transferring the graphene layer 15 on the generic substrate 16, as shown in FIG. 2F.

This technique has the drawback that it is not scalable on a large area and it is not used for mass production.

3) Transferring through polydimethylsiloxane or PDMS which is considered as a direct transfer. The technique is similar to those above described, apart that a PDMS layer is used both as support layer to transfer the graphene layer and also as a final substrate for it.

4) Transferring through a so called "Self assembly", which is a technique for generating and transferring highly ordered organic films with controlled thickness, so obtaining graphene flakes. This technique comprises:

dispensing, on the sub-phase surface inside an equipment pan, a solution of an organic substance, in particular graphene, to be deposited;

waiting for the complete evaporation of the solvent;

compressing the graphene film through barriers which reduce the area available for the molecules at the surface of the sub-phase;

transferring the graphene film by immerging and emerging perpendicularly the substrate from air to the sub-phase, according to the so called "Langmuir-Blodgett" deposition, or in a parallel manner by contacting the substrate surface with the film surface, according to the so called "Langmuir-Schaefer" deposition.

This technique has the drawback that the graphene productivity is very limited and involves a transferring on very small areas.

BRIEF SUMMARY

One embodiment of the present disclosure is a method for producing graphene on a large area and for allowing a transferring from a donor substrate to a different substrate, having functional and structural characteristics allowing to overcome the limits which still affect the methods previously disclosed with reference to the prior art.

One embodiment of the present disclosure transfers graphene from a donor substrate onto a different or final substrate by using a temporary substrate made by a dry film photo-resist. More particularly, the final substrate can be rigid or flexible and of different size and shape.

In this way, advantageously according to the disclosure, the donor substrate, on which a graphene layer is grown, is involved into the graphene transferring.

One embodiment is a method for transferring a graphene layer from a donor substrate onto a final substrate, which includes:

providing a metal layer on the donor substrate; and growing a graphene layer on the metal layer;

laminating a dry film photo-resist on the graphene layer;

laminating a tape on the dry film photo-resist;

chemically etching the metal layer, obtaining an initial structure comprising the tape, the dry film photo-resist and the graphene layer;

laminating the initial structure on the final substrate;

thermally releasing the tape, so as to obtain an intermediate structure comprising the dry film photo-resist, the graphene layer and the final substrate;

removing the dry film photo-resist; and obtaining a final structure comprising the final substrate with a transferred graphene layer.

More in particular, the disclosure comprises the following supplemental and optional features, taken alone or in combination.

According to an aspect of the disclosure, the step of removing the dry film photo-resist may comprise a step of chemical etching the dry film photo-resist.

According to another aspect of the disclosure, the step of removing the dry film photo-resist may also comprise the steps of exposing the dry film photo-resist film to UV light and chemically etching the graphene layer.

Moreover, according to an aspect of the disclosure, the step of laminating a dry film photo-resist on the graphene layer may comprise laminating a dry film negative photo-resist.

The metal layer may be a nickel layer or a copper layer.

Furthermore, according to another aspect of the disclosure, the donor substrate may comprise a semiconductor or insulator crystal substrate, a semiconductor device substrate, an epitaxial layer, a flexible substrate, a metal film, or an organic device substrate.

According to yet another aspect of the disclosure, the step of laminating a tape on the dry film photo-resist may comprise laminating a thermal releasing tape on the dry film photo-resist, to better mechanically support the dry film photo-resist itself.

Finally, according to a further aspect of the disclosure, the thermal release tape has a release temperature in the range of 90° C. and 200° C. and a lamination pressure ranging between 2 bar and 5 bar.

The characteristics and advantages of the method according to the present disclosure will be apparent from the following description of an embodiment thereof given by way of indicative and non-limiting example with reference to the annexed drawings.

BRIEF DESCRIPTION OF THE SEVERAL VIEWS OF THE DRAWINGS

In these drawings:

FIGS. 1A-1E schematically show different steps of a method for transferring graphene on a substrate using a thermal release tape, according to the prior art;

FIGS. 2A-2F schematically show different steps of a method for transferring graphene on a substrate using a liquid resist, according to the prior art;

FIG. 3A-3G show schematically different steps of a first embodiment of a method for transferring graphene on a substrate, according to the present disclosure; and FIGS. 4A-4G schematically show different steps of a second embodiment of a method for transferring graphene on a substrate, according to the present disclosure.

DETAILED DESCRIPTION

With reference to such figures, and in particular to FIGS. 3A-3G and, respectively, to FIGS. 4A-4G, different steps of a first and, respectively, a second embodiment of a method for transferring graphene from a donor substrate to a different or final substrate are shown.

It should be noted that the process steps being described hereinafter do not deal with a complete manufacturing process of a wafer. The present disclosure can be carried out along with the manufacturing techniques of integrated circuits being usually employed in the field.

Moreover, figures showing schematic views of the integrated structure during the manufacturing are not drawn in scale, being on the contrary drafted so as to emphasize features of the disclosure.

In particular, the method for transferring graphene from a donor substrate to a different or final substrate comprises, both in the first and in the second embodiments, steps shown respectively in FIGS. 3A-3E and 4A-4E Both method embodiments provide a donor substrate, in particular a metal layer 102 such as a nickel or a copper layer, on which a graphene layer 105 is provided, in particular grown through a chemical vapor deposition (CVD) technique, and laminating a dry film photo-resist 106 on the graphene layer 105, as shown in FIGS. 3A and 4A. It should be noted that the metal layer 102 could be provided on a separate donor substrate, the latter being a semiconductor or insulator crystal substrate, a semiconductor device substrate, an epitaxial layer, a flexible substrate, a metal film, or an organic device substrate, to name a few.

Both methods further include:
laminating a tape 101, with a release temperature in the range of 90° C. and 200° C., on the dry film photo-resist 106, as shown in FIGS. 3B and 4B;
chemically etching the metal layer 102 and releasing an initial structure 110 comprising the tape 101, the dry film photo-resist 106 and the graphene layer 105, as shown in FIGS. 3C and 4C;
laminating the initial structure 110 comprising the tape 101, the dry film photo-resist 106 and the graphene layer 105 on a different or final substrate 104, as shown in FIGS. 3D and 4D; and
thermally releasing the tape 101, so as to obtain an intermediate structure 107 comprising the dry film photo-resist 106, the graphene layer 105 and the final substrate 104, as shown in FIGS. 3E and 4E.

Moreover, the method according to the first embodiment further comprises:
removing the dry film photo-resist 106; and
obtaining a final structure 120A comprising the final substrate 104 with the transferred graphene layer 105.

It should be remarked that the transferred graphene layer 105 is a monolayer. Moreover, it should be noted that a dry film negative photo-resist could be usefully used.

In particular, according to the first embodiment, the method further comprises, after the step of thermally releasing the tape 101:
chemically etching away the entire dry film photo-resist 106, as shown in FIG. 3F, thereby obtaining the final structure 120A comprising the final substrate 104 with the transferred graphene layer 105, as shown in FIG. 3G.

According to the second embodiment, the method further comprises, after the step of thermally releasing the tape 101, the steps of:
exposing the dry film photo-resist 106 to UV light using a lithographic mask 125, in particular a dry film negative photo-resist, as shown in FIG. 4F, and
chemically etching the graphene layer 105 and removing the dry film photo-resist 106, obtaining a final structure 120B comprising the final substrate 104 with a patterned graphene layer 115, as shown in FIG. 4G.

According to an aspect of the disclosure, the transferred graphene layer 105 and the patterned graphene layer 115 have a maximum size depending only on the original graphene sheet size.

According to another aspect of the disclosure, the transferred graphene layer 105 and the patterned graphene layer 115 are compact and lack polymeric contaminants.

The methods according to the first and the second embodiments obtain integrated structures 120A, 120B comprising a substrate, in particular the final substrate 104, and a graphene layer 105, 115.

It should be remarked that the methods according to the present disclosure could be usefully used in order to realize an integrated semiconductor device, such as a field effect transistor (FET), realized on a silicon substrate and comprising a graphene layer as a channel thereof The advantages of the described graphene transferring method emerge clearly from the foregoing discussion.

In particular, advantageously according to the present disclosure, the graphene transferring method as described above allows to transfer large graphene areas at a controlled temperature ranging between 90° C. and 200° C. and a controlled pressure ranging between 2 bar and 5 bar.

In addition, advantageously according to the disclosure, it is possible to use a dry film photo-resist to act as transition layer for the graphene transferring on a final substrate and, at the same time, for the photo-lithographic definition of the graphene layer itself, for instance to form the channel of a transistor as above indicated, the donor substrate on which a graphene layer is grown being thus involved into the graphene transferring.

Another advantage relates to the fact that, using a dry film photo-resist, such a film does not interact with the graphene layer, thus eliminating the problems of polymeric contamination.

Moreover, the graphene transferring process as described is scalable on large area, namely it can be roll-to-roll.

Another advantage relates to the possibility to use the graphene transferring method according to the disclosure on every type of substrates, having any kind of size and shape.

Moreover, the graphene transferring method according to the disclosure may be used both on rigid substrates and on fragile, thin and flexible substrates.

Another advantage is that the graphene transferring method according to the disclosure can be easily implemented in a semiconductor industry.

Moreover, due to the planarity of the dry film photo-resist and to its conformability to different surfaces, the transferred graphene layer may be preserved from mechanical stresses caused by the known transferring steps on a substrate.

Another advantage relates to the fact that, using a dry film photo-resist, the processing temperature, the adhesion capacity and the surface roughness of this layer do not affect the transferring process.

Finally, also the thickness of the dry film photo-resist does not affect the transferring process.

Obviously, a technician of the field, aiming at meeting incidental and specific needs, will bring several modifications to the above described graphene transferring method, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    providing a metal layer;
    growing a graphene layer on said metal layer;
    laminating a dry film photo-resist on said graphene layer;
    laminating a tape on said dry film photo-resist;
    obtaining an initial structure, including said tape, said dry film photo-resist, and said graphene layer, by chemically etching away said metal layer;
    laminating said initial structure on a final substrate;
    obtaining an intermediate structure, including said dry film photo-resist, said graphene layer, and said final substrate, by thermally releasing said tape from the graphene layer; and
    obtaining a final structure, wherein obtaining the final structure includes removing said dry film photo-resist, wherein the dry film photo-resist is a UV-sensitive dry film photo-resist.

2. A method according to claim 1, wherein removing the dry film photo-resist comprises chemically etching said dry film photo-resist.

3. A method according to claim 1, wherein obtaining the final structure includes:
    patterning said dry film photo-resist by exposing said dry film photo-resist film to ultraviolet light through a mask; and
    patterning said graphene layer by chemically etching said graphene layer through the patterned dry film photo-resist.

4. A method according to claim 1, wherein laminating the dry film photo-resist on said graphene layer comprises laminating a dry film negative photo-resist with a thickness in a range of 10-100μm on said graphene layer.

5. A method according to claim 1, wherein said metal layer is a nickel layer or a copper layer.

6. A method according to claim 1, wherein providing said metal layer includes forming the metal layer on a donor substrate that includes at least one of a semiconductor or insulator crystal substrate, a semiconductor device substrate, an epitaxial layer, a flexible substrate, a metal film, and an organic device substrate.

7. A method according to claim 1, wherein laminating the tape on said dry film photo-resist comprises laminating a thermal releasing tape on said dry film photo-resist.

8. A method according to claim 1, wherein laminating the tape uses a thermal release tape having a release temperature in the range of 90° C. and 200° C. and a lamination pressure ranging between 2 bar and 5 bar.

* * * * *